United States Patent
Hsu et al.

(10) Patent No.: US 7,283,410 B2
(45) Date of Patent: Oct. 16, 2007

(54) REAL-TIME ADAPTIVE SRAM ARRAY FOR HIGH SEU IMMUNITY

(75) Inventors: Louis L. Hsu, Fishkill, NY (US); Jack A. Mandelman, Flat Rock, NC (US); Robert C. Wong, Poughkeepsie, NY (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 11/308,215

(22) Filed: Mar. 13, 2006

(65) Prior Publication Data

US 2007/0211527 A1    Sep. 13, 2007

(51) Int. Cl.
*G11C 7/00* (2006.01)
(52) U.S. Cl. ......................................... 365/201; 714/42
(58) Field of Classification Search ................ 365/201; 714/42
See application file for complete search history.

(56) References Cited

U.S. PATENT DOCUMENTS

| | | | |
|---|---|---|---|
| 4,983,843 A | | 1/1991 | Thomson |
| 5,657,267 A | * | 8/1997 | Levi ........................... 365/149 |
| 6,583,470 B1 | | 6/2003 | Maki et al. |
| 6,785,169 B1 | | 8/2004 | Nemati et al. |

OTHER PUBLICATIONS

Soli, et al., "Proton-Sensitive Custom SRAM Detector", IEEE Nuclear Science Symposium and Medical Imaging Conference, 1991, vol. 3, pp. 1541-1545.
Yang, et al., "Design of Sub-50 nm FinFET Based Low Power SRAMs", Berkeley Mid-term report, pp. 1-5.
Yang, et al., "Design of FinFET based SRAMs", UC Berkeley EE 241 Project, May 8, 2003.

* cited by examiner

*Primary Examiner*—Tuan T. Nguyen
*Assistant Examiner*—N Nguyen
(74) *Attorney, Agent, or Firm*—Scully, Scott, Murphy & Presser, P.C.; Lisa U. Jaklitsch, Esq.

(57) ABSTRACT

A system and method for automatically adjusting one or more electrical parameters in a memory device, e.g., SRAM arrays. The system and method implements an SRAM sensing sub-array for accelerated collection of fail rate data for use in determining the operating point for optimum tradeoff between single event upset immunity and performance of a primary SRAM array. The accelerated fail rate data is input to an algorithm implemented for setting the SEU sensitivity of a primary SRAM memory array to a predetermined fail rate in an ionizing particle environment. The predetermined fail rate is maintained on a real-time basis in order to provide immunity to SEU consistent with optimum performance.

20 Claims, 6 Drawing Sheets

FIG. 1
(PRIOR ART)
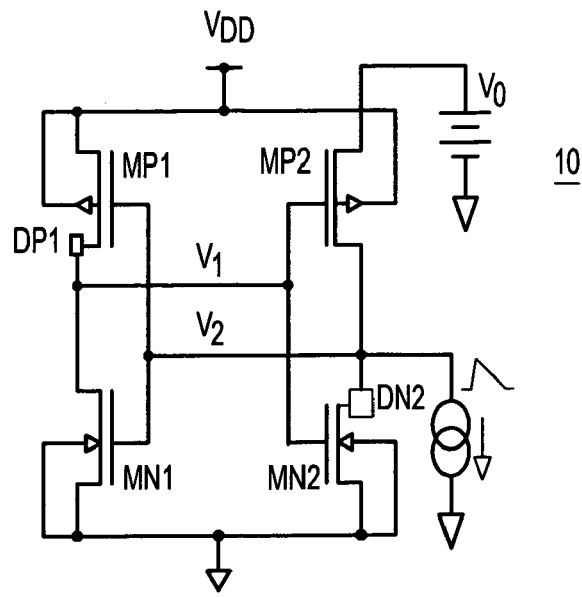
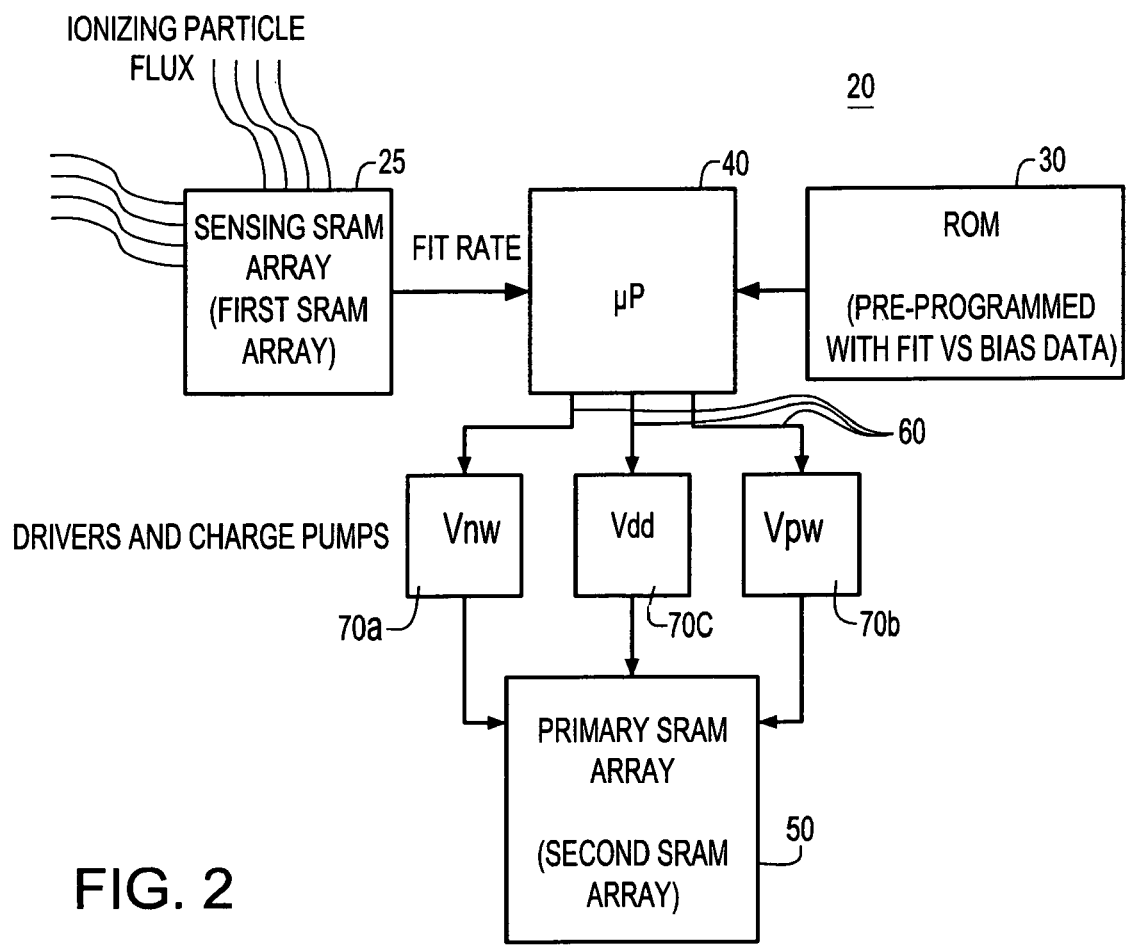
FIG. 2

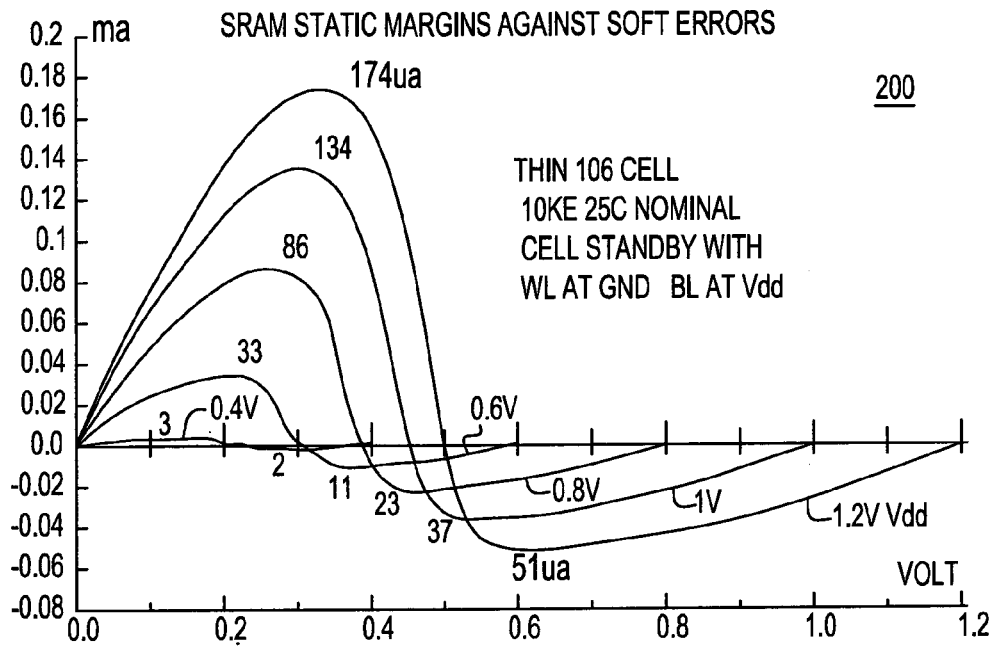

REAL-TIME ADAPTIVE SRAM ARRAY FOR HIGH SEU IMMUNITY

BACKGROUND OF THE INVENTION

1. Field of the Invention

The present invention relates generally to semiconductor memory structures, e.g., SRAM, and particularly, an SRAM cell structure, array architecture and method of operation which provides a real-time adaptive tradeoff between immunity to single event upset (SEU) due to ionizing particles (including proton, neutron, pion, alpha particle, or heavy ions) and performance.

2. Description of the Prior Art

In single event upsets (SEU) due to ionizing events caused by comic rays, particles from terrestrial sources, and materials in proximity to the chip present a reliability challenge to semiconductor memories (e.g. SRAM, DRAM) and logic circuits. High performance SRAM sensitivity to cosmic rays—measured on the basis of fails per bit—has dropped by about 10× over the last 15 years, while the bits/chip has increased 1000×; hence the net fail rate per chip has increased about 100 times. Modern CMOS chips are increasingly more sensitive to neutrons below 100 MeV.

The approach taken by the industry to provide acceptable immunity to SEU has been overkill in design. For example, bulk CMOS SRAM cells having higher than necessary internal node capacitance, overly conservative beta ratio, higher than necessary supply voltage and well back bias are commonly employed, solely for the purpose of SEU concerns. The price for this conservative design is compromised performance, specifically, array access times. Once designed, the SEU exposure of these SRAM is frozen.

Currently, no structure or teaching in the art has been found which suggests the use of an SRAM sensing sub-array for accelerated collection of fail rate data for determining the operating point for optimum tradeoff between single event upset immunity and performance of a primary SRAM array, and providing real-time adaptive control of the operating conditions of the primary SRAM array.

Prior art teachings exist that, in part, teach the adjustment of various SRAM cell operating voltages to alter the sensitivity to SEU. For instance, the reference entitled "Proton-Sensitive Custom SRAM Detector", by G. A. Soli, et al, IEEE Nuclear Science Symposium and Medical Imaging Conference, 1991, pp. 1541-1545, vol. 3, teaches a specially designed SRAM cell used as a proton sensor as shown in FIG. 1. The SRAM cell 10 shown in FIG. 1 includes a first inverter tied to a normal supply Vdd (=5V), while the second inverter is tied to a tunable voltage level Vo. The cell is initially loaded with a "low state" at node V1 and a "high state" at node V2. Due to the existing off-set, the cell is susceptible to be upset by heavy ion events. There are at least three disadvantages of this design: (1) The cell is inherently unbalanced; even when Vo=Vdd, the cell is still not fully balanced since two inverters are connected to two different power supplies. (2) This SRAM array can only be used as a particle monitor and cannot be used in normal operation with high reliability. (3) Since the cell has a built-in off-set, it is vulnerable to other types of errors such as read and/or write disturbances. Therefore, it would be difficult to distinguish whether the bit error is caused by radiation induced soft-error or other types of error mechanism.

U.S. Pat. No. 6,785,169 directed to memory cell error recovery, describes how the soft error rate in a semiconductor memory is improved via the use of a circuit and arrangement adapted to use a mirror bit to recover from a soft error. According to this reference, a semiconductor device includes first and mirror memory cells configured and arranged to receive and store a same bit in response to a write operation, with the memory cells more susceptible to a bit error in which the stored bit changes from a first state to a second state than to a change from the second state into the first state. The memory cells are separated by a distance that is sufficient to make the likelihood of both memory cells being upset by a same source very low. For a read operation, the bits stored at the first and second memory cells are compared. If the bits are the same, the bit from the first and/or mirror bit is read out, and if the bits are different, a bit corresponding to the more susceptible state is read out. In this manner, soft errors can be overcome. While using two identical arrays to catch and correct soft error is advantageous, it provides no means for speeding up error rate detection.

U.S. Pat. No. 6,583,470 directed to radiation tolerant back biased CMOS VLSI, describes a CMOS circuit formed in a semiconductor substrate having improved immunity to total ionizing dose radiation, improved immunity to radiation induced latch up, and improved immunity to a single event upset. However, this reference provides no means for improving the reliability of memory arrays by determining the actual SEU exposure to a given radiation environment; rather, the focus of this device is to boost the immunity to radiation induced upset on CMOS logic circuits.

U.S. Pat. No. 4,983,843 directed to a radon gas detector instrument comprising: a filter for trapping alpha radon daughters of said gas, an air pump for drawing ambient air through the filter, a DRAM devoid of an alpha particle barrier layer, located adjacent the filter, for exposure to alpha particles trapped by the filter, apparatus for cyclically relaxing all cells of the DRAM, waiting for a significant period of time for cells of the DRAM to become charged by said alpha particles, then reading the DRAM to determine the number of charged cells in the DRAM, a display connected to the relaxing, waiting and reading means for displaying a count of the number of charged cells in units correlated to the intensity of radon gas in the ambient air. This reference is silent as to methods for accelerating SER and it would take significant period of time to collect the information.

Accordingly there is a need to provide a novel system and method for automatically adjusting one or more electrical parameters in memory, e.g., SRAM arrays, and more particularly, a novel system and method for setting the SEU sensitivity of a primary SRAM memory array to a predetermined fail rate in an ionizing particle environment.

It would thus be highly desirable to provide a novel memory structure, e.g., SRAM array, that enables combinations of the beta ratio, N-well bias, and the power supply of the cell to be dynamically adjusted to assure immunity to upsets of the internal latched state of the SRAM cells caused by an ionizing particles, while maximizing the cell performance.

SUMMARY OF THE INVENTION

The present invention is directed to a system and method for automatically adjusting one or more electrical parameters in memory, e.g., SRAM arrays, and more particularly, a novel system and method for setting the SEU sensitivity of a primary SRAM memory array to a predetermined fail rate in an ionizing particle environment. The predetermined fail rate is maintained on a real-time basis in order to provide immunity to SEU consistent with optimum performance.

In accordance with the present invention, there is provided a system and method for automatically adjusting one or more of the following parameters in primary SRAM arrays: (1) SRAM cell P-well bias (hence the beta ratio), (2) N-well bias, and (3) the array power supply voltage. The primary SRAM arrays are the SRAM memory that typically serves as cache for a microprocessor.

In addition to the primary SRAM arrays, an SRAM sensing sub-array is provided. The SRAM sensing sub-array is intentionally set to have high sensitivity to SEU in order to determine and set the optimum operating point of the primary SRAM arrays. The high SEU sensitivity of the sensing sub-array provides a means for collecting accelerated SEU data which is then applied as input to an algorithm for determining the desired operating point of the primary SRAM arrays.

Once the radiation characteristics of the environment are determined by the SRAM sensing sub-array, one or more of the above mentioned electrical parameters may be adjusted in the primary SRAM arrays. For the primary SRAM arrays, combinations of the beta ratio, N-well bias, and the power supply of the cell can be dynamically adjusted to assure immunity to upsets of the internal latched state of the SRAM cells caused by an ionizing particles, while maximizing the cell performance.

According to a first aspect of the invention, there is provided a system and method for adapting sensitivity of a memory device to single event upsets (SEUs) due to ionizing particles, the method comprises:

providing a first memory device adapted for receiving single event upsets due to ionizing particles;

generating fail rate data at the first memory device;

providing a control device for receiving the fail rate data input from the first memory device;

determining a predetermined SEU fail rate for the second memory device;

dynamically applying voltage biases to a second memory device, the voltage biases optimally mapped according to the predetermined SEU fail rate, wherein an operating point for the second memory device is dynamically achieved that balances SEU immunity and memory device performance.

The determining of a predetermined SEU fail rate for said second memory device comprises: comparing fail rate data generated by the first memory device with pre-programmed data describing dependence of bit fail rate of the second memory device to the N-well supply voltage (Vnw), P-well supply voltage (Vpw) and a device supply voltage Vdd.

The determining of a predetermined SEU fail rate comprises:

converting said fail rate data generated by said first memory device to a nominal fail rate value representing a failure rate with nominal bias in a given physical environment;

comparing said nominal fail rate value against a pre-programmed value indicating a maximum failure rate allowed for said given physical environment; and, calculating a soft error margin value representing the difference between the maximum allowed failure rate value and said nominal fail rate value.

Preferably, the calculated soft error margin value is mapped to optimal voltage bias settings for said second memory device.

BRIEF DESCRIPTION OF THE DRAWINGS

These and other objects, features and advantages of the present invention will become apparent from the following detailed description of illustrative embodiments thereof, which is to be read in connection with the accompanying drawings, in which:

FIG. 1 depicts a specially designed SRAM cell used as a proton sensor according to the prior art;

FIG. 2 depicts a circuit block diagram according to one embodiment of the invention;

FIG. 7 depicts SRAM stability as characterized by Ncurves;

FIG. 8 depicts the signature of the Ncurve (i.e., magnitudes of Icrit0 and Icrit1) used for determining whether the cell is most sensitive to electron collection or hole collection;

DETAILED DESCRIPTION OF THE PREFERRED EMBODIMENTS

Figure 3:
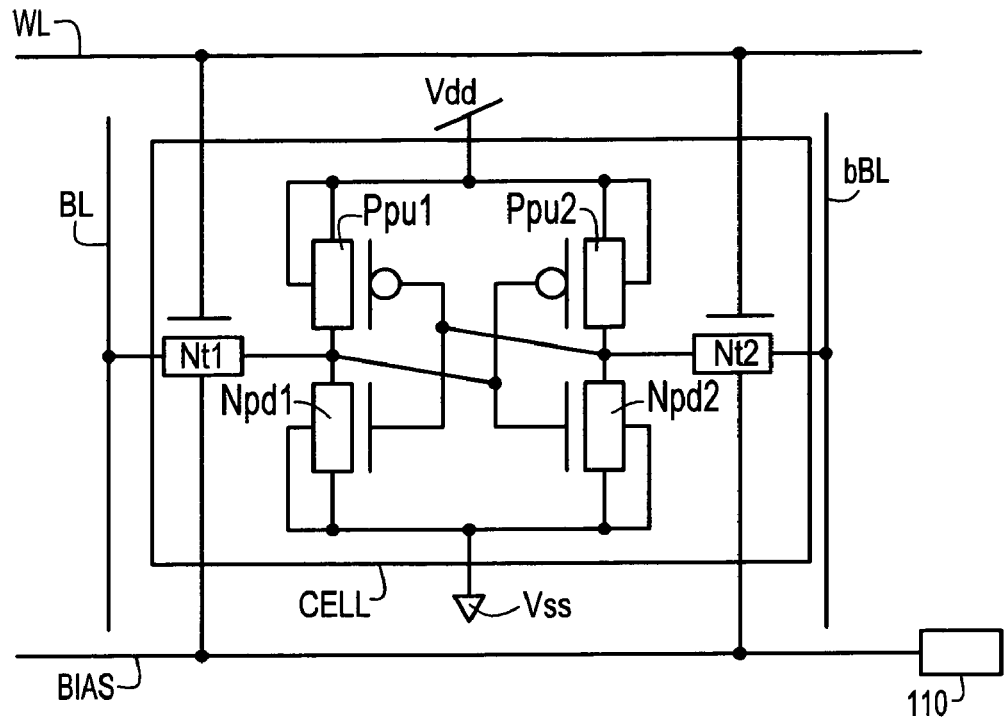
FIG. 3 depicts an exemplary SRAM cell 100 from which a beta ratio is determined according to the present invention.

The present invention provides a system and method for automatically adjusting one or more electrical parameters in memory, e.g., SRAM arrays, and more particularly, a novel system and method for setting the SEU sensitivity of a primary SRAM memory array to a predetermined fail rate in an ionizing particle environment. The predetermined fail rate is maintained on a real-time basis in order to provide immunity to SEU consistent with optimum performance.

A block diagram of the inventive system 20 is illustrated in FIG. 2. As shown in FIG. 2, a first SRAM memory array 25 (sensing sub-array) is provided for the purpose of collecting accelerated SEU data from its interaction with the particles in the ionizing particle flux environment. The above-mentioned SEU data is then applied to a reliability algorithm for determining the electrical operating conditions required to obtain a predetermined SEU fail rate for a second (primary) SRAM array 50. The reliability algorithm determines the value of one or more of the following parameters required to ensure reliable operation of the second SRAM array 50 in the ionizing particle environment: 1) the P-well bias on the NFET transfer devices, or common P-well bias on the transfer and pull-down devices, and hence the beta ratio, 2) the array supply voltage Vdd, and 3) the N-well bias of the PFET pull-ups. By dynamically adjusting the electrical operating conditions of the second (primary array) SRAM array 50, SEU reliability and optimum performance is assured at all times.

According to the embodiment depicted, SRAM cells in the first (sensing sub-array) SRAM array are always kept in a balanced state; that is, to ensure that no built-in offset exists. This assures that detected fails in the first SRAM array 25 are due only to radiation induced soft-errors. The cell stability of the first SRAM array (sensing sub-array) is intentionally degraded in order to determine SEU susceptibility in a much shorter time period than possible with prior art methods. The data provided by the first SRAM array 25 enables sorting out the PFET fails (due to hole collection) from NFET fails (due to from electron collection), which information is used to decide on which biasing voltage to adjust in the second SRAM array (primary).

It should be understood that the first SRAM array 25 (sensing sub-array) is calibrated as part of the chip design process. Dependence of SEU fail rate on biasing voltages, obtained from ionizing particle radiation reliability stressing in a controlled environment, is programmed into an on-chip, read only memory. These dependencies establish a one-to-one correspondence between SEU failure rate and electrical biases for the second (primary) SRAM array 50. Thus, by obtaining the SEU failure rate of the first (sensing sub-array) SRAM array 25 the electrical operating biases are applied to the second SRAM (primary) array 50 to maintain a desired SEU failure rate.

In view of FIG. 2, the first sensing SRAM array ($1^{st}$ SRAM array) 25 collects accelerated fail rate data, i.e., a soft error metric referred to as failure-in-time (FIT) data, by generating bit fails in the ionizing particle operating environment. This first SRAM array 25 is intentionally designed to be highly susceptible to radiation induced SEU, by operating with high back bias (source to P-well) on the NFET transfer devices, high N-well bias on the PFET pull-up devices, and/or low supply voltage (Vdd). The bit fail rate data from the sensing SRAM 25 is input to a processing device, e.g., a microprocessor 40, where it is compared with the pre-programmed data included in ROM memory 30. The pre-programmed data includes the information describing the dependence of bit fail rate of the primary SRAM array (second SRAM array) 50 to the N-well supply voltage (Vnw), P-well supply voltage (Vpw) and supply voltage Vdd. The dependencies of the SEU fail rate to the various electrical biases of the second SRAM array 50 is described in greater detail hereinbelow. The microprocessor 40 then calculates the N-well, P-well and/or supply voltages that need to be set on the primary SRAM array 50 to achieve a predetermined fail rate in the present environment. Output signals 60 from the microprocessor 40 control charge pumps 70a, 70b, 70c for each of the control voltages.

Figure 12:
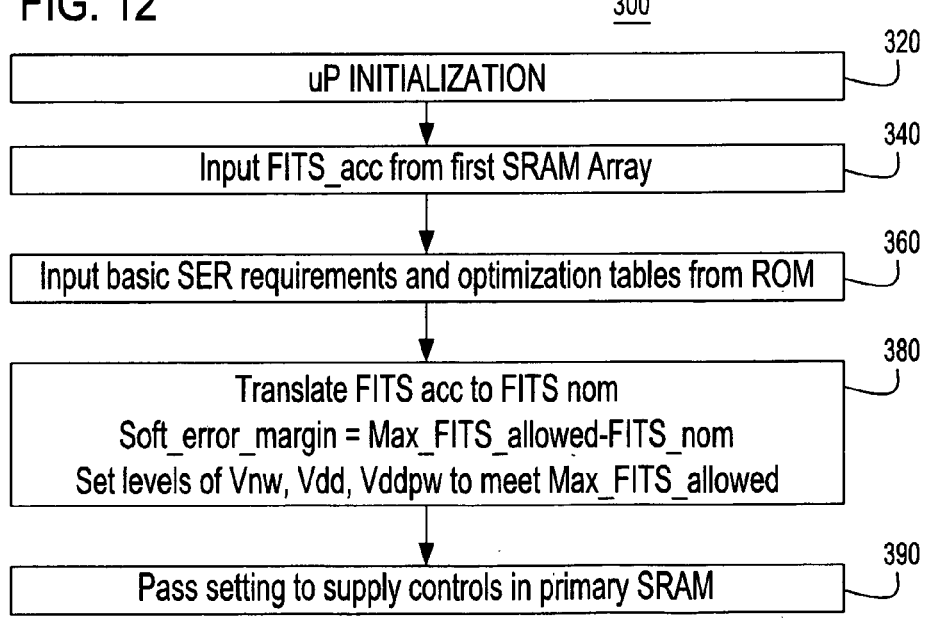

A methodology 300 for adapting the second SRAM array 50 for high SEU immunity, is now described with respect to FIG. 12. As shown in FIG. 12, in a first step 320, the microprocessor, microcontroller, or like control device is initialized. Then, at step 340, there is depicted the step of the microprocessor receiving fail data input from the first (sensing) SRAM array. That is, at step 340, the microprocessor receives FITS_acc data (represents the probability of cell fail or 'upset' in ppm/kbit/khour. From the sensing SRAM array ($1^{st}$ SRAM array) where FITS_acc data represents the accelerated SEU failure rate with a worst case bias setting. Then, at step 360, the microprocessor accesses, i.e., receives, basic SER (Soft_Error_Rate) requirements data and other pre-programmed data included in ROM memory 30. This pre-calculated data includes optimization tables having data that maps the dependence of bit fail rate of the primary SRAM array 50 to one or more of N-well supply voltages (Vnw), P-well supply voltages (Vpw) and Vdd supply voltages. That is, one optimization table (in ROM) is provided with basic SEU requirements data comprising: a combination of N-well supply voltage (Vnw), P-well supply voltage (Vpw) and Vdd supply voltage values for a given bit fail rate of the primary SRAM array 50. The basic SER requirements data is referred to herein as max_FITS_allowed. The possible SRAM adjustment is referred to as Soft_Error_Margin which comprises a value that will vary if the computing system is in a particular computing environment, e.g., high atop a mountain where Soft_Error_Margin is expected to be small or even negative, or in a submarine at the bottom of the sea where Soft_Error_Margin is expected to be large. Thus, continuing at step 380, there is depicted a first sub-step of translating FITS_acc to a FITS_nom value, where FITS_nom represents the failure rate with nominal bias in the particular (physical) environment that may be greater or smaller than the max_FITS_allowed. That is, a look-up table that has been established from soft error simulations is provided that correlates the SER of some severe bias conditions to the SER of some 'nominal' or typical bias conditions. Some 'severe' bias is needed to shorten the time to collect Soft Error data from 1 st SRAM array (FIG. 2) as chip fails may not occur otherwise in the testing time window.

Continuing further as indicated at step 380, there is depicted a further sub-step of calculating a soft_error_margin representing the difference between the max_FITS_allowed and FITS_nom; i.e., Soft_Error_Margin=max_FITS_allowed−FITS_nom. The Soft_Error_Margin becomes a search argument for the proper bias setting and will vary if the computing system is in a particular computing environment, e.g., high atop a mountain. Then, as further in step 380, there is performed the sub-step of actually setting the levels of Vnw, Vdd, Vpw to meet max_FITS_allowed. An example optimization table used for this purpose is as shown in Table 1 which maps the Soft_Error_Margin values with optimum Vnw, Vdd, Vpw supply level values as follows:

TABLE 1

| Soft_Error_Margin/ | Supply level No. | | |
|---|---|---|---|
| max_FITS_allowed | Vdd | Vnw | Vpw |
| +10 | 1 | 1 | 6 |
| +0.001 | 4 | 4 | 4 |
| −10 | 6 | 3 | 1 |
| ... | ... | ... | ... |

As shown in Table 1, a Soft_Error_Margin/max_FITS_allowed value is calculated to normalize the soft error rate into a non-dimensional number for simpler reference.

Finally, as shown in FIG. 12, step 390, each of the Vnw, Vdd, Vddpw level settings as provided from the optimization tables are passed to supply controls in the primary SRAM.

It is understood that the actual FIT values change with environment. If FITS_nom calculated from FITS_acc (first sub-step 380) is below the max_FITS_allowed, Vdd can be lowered and Vnw can be raised to reduce system power dissipation and extend chip life; Vpw can also be raised to speed-up SRAM access. Otherwise, the Soft_Error_Margin of that particular environment would be wasted. On the other hand, if this Soft_Error_Margin turns out negative as shown in row 3 of table 1, the chip will not be reliable since the max_FITS_allowed has been exceeded. To maintain the system reliability, bias will have to be set to levels where SER is reduced.

Further, with respect to providing a bias setting, this setting is a result looked up from the optimization table for actual SRAM operations. For example, Vnw, Vdd Vpw can be encoded into 3 bits, with 3 above a nominal level and 4 below a nominal level. For example, Vdd and Vnw may have eight (8) levels of 1.5 1.4 1.3 1.2 1.1 1.0 0.9 0.8V while, Vpw may have 8 levels of 0.0 0.1 0.2 0.3 0.4 0.5 0.6 0.7V.

Given these value settings, and assuming the Voltage generators (for Vdd, Vnm and Vpw) of the primary SRAM array are adjustable to eight possible levels, then the µP optimization routine determines which 'optimal' level should be used. In the digital world, 1 choice out of 8 is expressed in 3 bits. For example, the 'encoding' for the voltage levels may be performed as shown in Table 2 as follows:

TABLE 2

| Level Numbers | Bit Pattern | Vdd | Vnw | Vpw |
|---|---|---|---|---|
| 0 | 000 | 0.8 V | 0.8 V | −0.3 V |
| 1 | 001 | 0.9 V | 0.9 V | −0.3 V |
| 2 | 010 | 1.0 V | 1.0 V | −0.2 V |
| 3 | 011 | 1.1 V | 1.1 V | −0.1 V |
| 4 | 100 | 1.2 V (nom) | 1.2 V (nom) | 0.0 V (nom) |
| 5 | 101 | 1.3 V | 1.3 V | 0.1 V |
| 6 | 110 | 1.4 V | 1.4 V | 0.2 V |
| 7 | 111 | 1.5 V | 1.5 V | 0.3 V |

Generally, there is a 'nominal' supply level, e.g., a nominal bias for Vdd=1.2V, for Vnw=1.2V, and for Vpw=0.0V. Those 3 bits are passed from the µP to the primary SRAM array via data input lines (e.g., conducting wires), as digital input signals to the voltage generators. Three supplies sources providing Vdd, Vnw and Vpw voltages have been used in the example. It is understood that the Vdd itself may be subdivided into Vdd_wordline, Vdd_bitline and Vdd_cell for finer stability adjustments at the cost of more voltage generators.

As mentioned, according to the invention, the alpha ratio and beta ratio, N-well bias, and power supply of an SRAM array are controlled independently, to dynamically adjust its SEU fail rate. A pre-calibrated sensing SRAM array collects accelerated SEU data that is then used to determine the appropriate voltage biases to be dynamically applied for a predetermined SEU fail rate. This system and method results in achieving optimum performance at the predetermined SEU fail rate. A discussion of the dependencies of the SEU fail rate to the various electrical biases of the second SRAM array (primary) is now provided.

As shown in FIG. 3 depicting a circuit schematic of an exemplary SRAM cell 100 of typical SRAM design having a group of six (6) transistors, four of which indicated as Ppu1, Ppu2, Npd1 and Npd2 are in a cross-coupled latch configuration. In such a configuration, as shown in FIG. 3, read and write access to the SRAM cell is accomplished via BL (e.g., true side) and bBL (e.g., complement side) the respective bit line and bit line complement and are accessed by controlling respective access transistors Nt1 and Nt2 and the word line signal (WL). In view of FIG. 3, the beta ratio (β) of the SRAM cell array 100 is defined as the ratio of transconductance of the pull down driver device ($gm_{pd}$) to the transconductance of the transfer device ($gm_t$), that is:

$$\beta = gm_{pd}/gm_t$$

Alternatively construed, the alpha ratio (α) is a measure of the relative strength of pull-up to pull-down for a given inverter stage, or, alternately, it is the ratio of a given stage's PFET width/length quotient to its NFET width/length quotient, at the wafer level. As the value of alpha gets larger, pull-up strength increases and the switchpoint potential of the stage rises. Suitable alpha ratio and beta ratio is necessary to ensure cell stability against noise or SEU disturbance.

Figure 4:
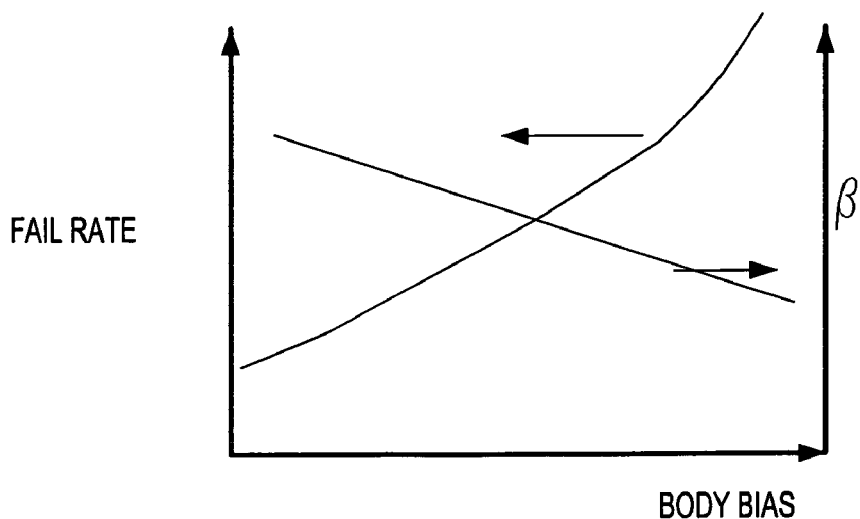
FIG. 4 graphically depicts the dependence of fail rate on body bias that can be used by a reliability algorithm to set the P-well bias on the transfer devices of the primary SRAM array 50.

Thus, during a read operation, high beta ratio means lower zero state, therefore, after reading the data out, the low state will stay low. As the threshold of these devices is increased, the noise margin of the cell also increases. It is conceivable that the beta ratio of the SRAM array can be changed so that cell stability is compromised. An easy way to tune the beta ratio is to separately bias the body of the transfer devices Nt1 and Nt2 (FIG. 3) so that its threshold level of each is altered (e.g., increased) thus changing the beta ratio (e.g., decreased). This may be performed by programmable bias voltage device 110 as shown in FIG. 3. By fabricating SRAM on SOI, or on bulk substrate having a triple-well structure, it is possible to locate the nMOS transfer devices inside a P-well which is separate from the nMOS driver devices. Body bias of the transfer devices may additionally be dynamically raised to adjust the beta ratio of SRAM cells. When the beta ratio is lowered to 1.0 or less, the first SRAM (sensing sub-array) array 25 (FIG. 1) becomes more susceptible to SEU as shown in FIG. 4, making it ideal for collection of accelerated data. Dependence of fail rate on body bias, such as shown in FIG. 4, is then used by the reliability algorithm to set the P-well bias on the transfer devices of the SRAM (primary) array 50.

Figure 5:
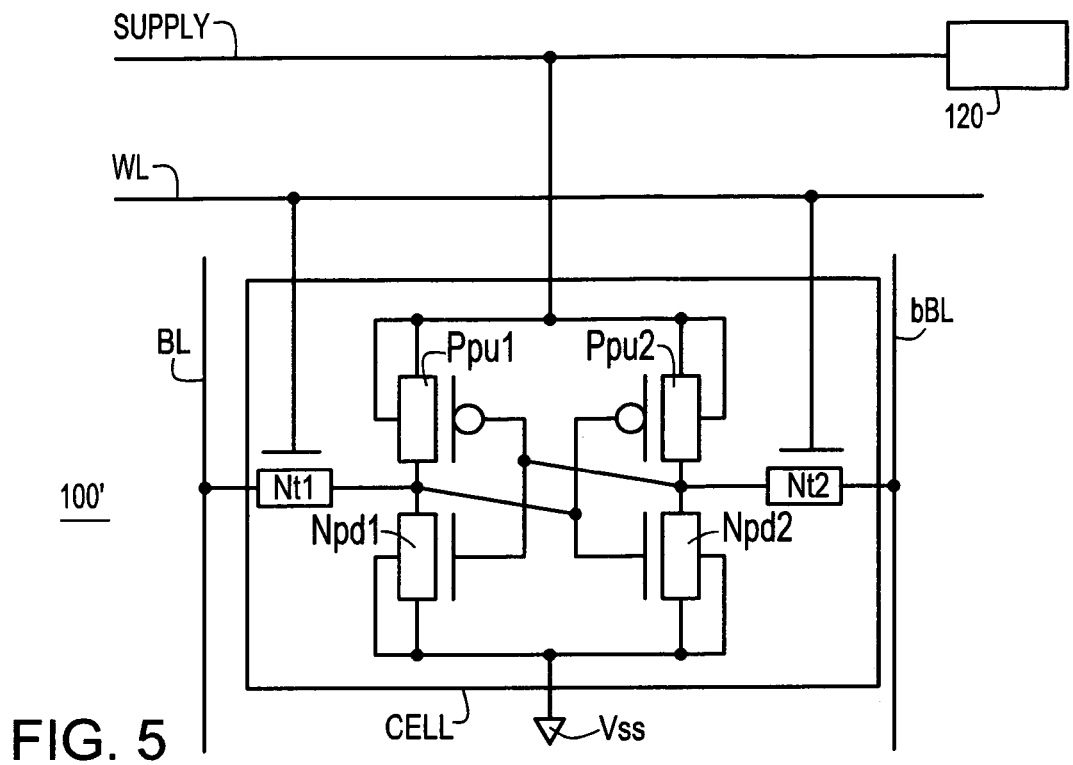
FIG. 5 depicts an exemplary SRAM cell 100' and the dynamic adjustment of a Power Supply Level for the cell.
Figure 6:
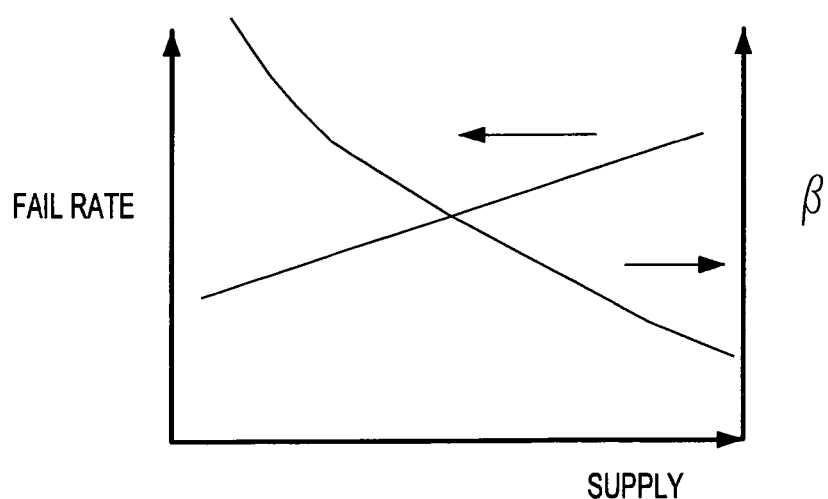
FIG. 6 graphically depicts the dependence of fail rate on power supply that can be used by a reliability algorithm to set the Power supply voltage on the transfer devices of the primary SRAM array 50.

According to a further aspect of the invention, as shown in FIG. 5, the Power Supply Level of the SRAM array 100' is dynamically adjusted. Particularly, as it has been reported that noise margin is improved by increasing the power supply level (see the reference "Design of Sub-50 nm FinFET Based Low Power SRAM", by Jing Yang, Sriram Balsubramanin, Berkeley Mid-term report), the SRAM arrays 100' are designed such that the power supply voltage can be controlled independently and dynamically by programmable voltage supply device 120, as shown in FIG. 5. For accelerated SEU testing performed by the first (sensing) SRAM sub-array 25, the power supply of the monitoring array is judiciously lowered to facilitate accelerated collection of fail rate data. That is, the first SRAM (sensing sub-array) array 25 (FIG. 1) becomes more susceptible to SEU as shown in FIG. 6, making it ideal for collection of accelerated data. Based on the accelerated fail rate data, the reliability algorithm determines the power supply level to be applied to the primary SRAM array 50.

As shown in FIG. 7, SRAM stability are characterized by the Ncurves, an Ncurve being an I-V (current-voltage) plot generated when the cell node voltage (x-axis) is swept between Vss (or ground) and Vdd (power supply). In this aspect, "I" is the current thru the voltage source forcing the sweep. It is understood that the voltage sweep may be from Vss to Vdd or, the other way around. The current will cross the zero current three times for a stable cell.

According to the invention, metrics that may be used for predicting soft error sensitivity are the Icrit0 & Icrit1 values, as illustrated by the plot 200 of Ncurves as illustrated in FIG. 7. Icrit0 is defined as the peak disturb current that the ZERO node can tolerate (positive peak current in the Ncurve). Icrit1 is the maximum tolerable leakage current from the ONE node (most negative current on the second half of the Ncurve). For example at Vdd=1.2V, the cell can tolerate soft hit of positive current of about 170 μA as shown in FIG. 7. However, if the ONE node leaks down due to collection of electrons generated by the soft hit, the tolerance is only about 50 μA. Thus, the NFETs are more prone to soft errors because the NFET depletion region retains electrons.

Referring once again to FIG. 7, to further elaborate, Icrit0 is the maximum critical current near the Vss end of the x-axis, and Icrit1 is the absolute value of the most negative critical current near the Vdd end of the x-axis. Icrit0 is the maximum tolerable leakage current (holes collected by a pullup PFET) into the node "ZERO" before the cell can be flipped. On the other hand, Icrit1 is the maximum tolerable leakage current (electrons collected by a pulldown NFET) away from the node "ONE", before the cell can be flipped. If Icrit0 or Icrit1 are sufficiently large then the chance of soft errors becomes very low. In a way, Icrit0 & Icrit1 are similar to the traditional soft error Qcrit (critical charge) with the mean time constant. As shown in FIG. 8, the SRAM is in standby, with wordlines (or WLs) at Vss, Bitlines (or BLs) at Vdd. Here, since Icrit0 is sufficiently larger than Icrit1 the soft errors are more likely to be dominated by electron collection by pulldown NFETs. Thus, the signature of the Ncurve (magnitudes of Icrit0 and Icrit1) enables the determination of whether the cell is most sensitive to electron collection or hole collection, adding to the data for determining to which devices dynamic adjustments should be made. Data extracted from FIG. 8 (FIG. 9) shows that SRAM stability margins drop with decreasing power supply voltage.

As shown in FIG. 8, a simple way to reduce Icrit1 is to lower the Vdd (power supply). When lowering Vdd to 0.6V from 1.2V, Icrit1 is reduced 5× (51 μa/11 μa). As a result, the test time is expected to be a few orders of magnitude faster. Although lowering Vdd is the easiest way to weaken the cell, the samples must also be screened for defects such as gate leakage. Generally healthy SRAM cells can retain data below a Vdd of 0.6V. However, for some SRAMs, device defects that escape conventional testing could affect the Soft Error test results. In that scenario, it would not be clear if the SRAM fails are really caused by alpha, or other high-energy particles. Thus, Vdd should not be lowered below 0.75V for the first SRAM array (sensing sub-array). It is clear that a reliable Icrit1 reduction may be around 3× instead of 5×.

Figure 9:
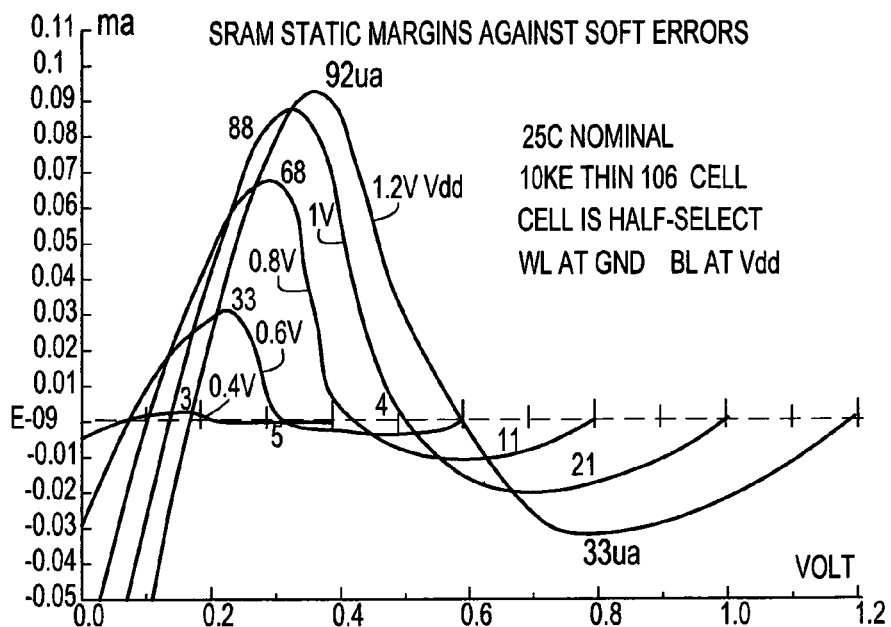
FIG. 9 depicts corresponding Ncurves associated when running a flood test under pinched Vdd during a soft error test.

According to a further aspect of the invention, as shown in FIGS. 3 and 5, further increased soft error sensitivity of the first SRAM array (sensing sub-array) may be obtained by turning on the wordline (WL). At Vdd=1.2V, turning on the WL drops Icrit0 & Icrit1 from 174 μa and 51 μa, respectively, to 92 μa and 33 μa, respectively, as shown in FIG. 9. Thus turning on WL is efficient in weakening the cell stability, at the cost of DC currents. Thus, the soft error acceleration may be performed with one WL at a time. Most likely, the test is performed with rippling WL's, while the BL's are clamped to Vdd. This is generally referred as the SRAM flood test.

For a still further acceleration in SEU the flood test is run under pinched Vdd during the soft error test. The corresponding Ncurves are shown in FIG. 9. During the flood test, WL & BLs are held at Vdd. At Vdd=0.6V, the Icrit1 is thus further reduced by ~3× (11 μA/4 μA). The degree of the sensitization will be less since only one WL is turned on each time. It is however conceivable that the existing designs can be modified to allow multiple WLs to be on simultaneously to speed up the test.

Figure 10:
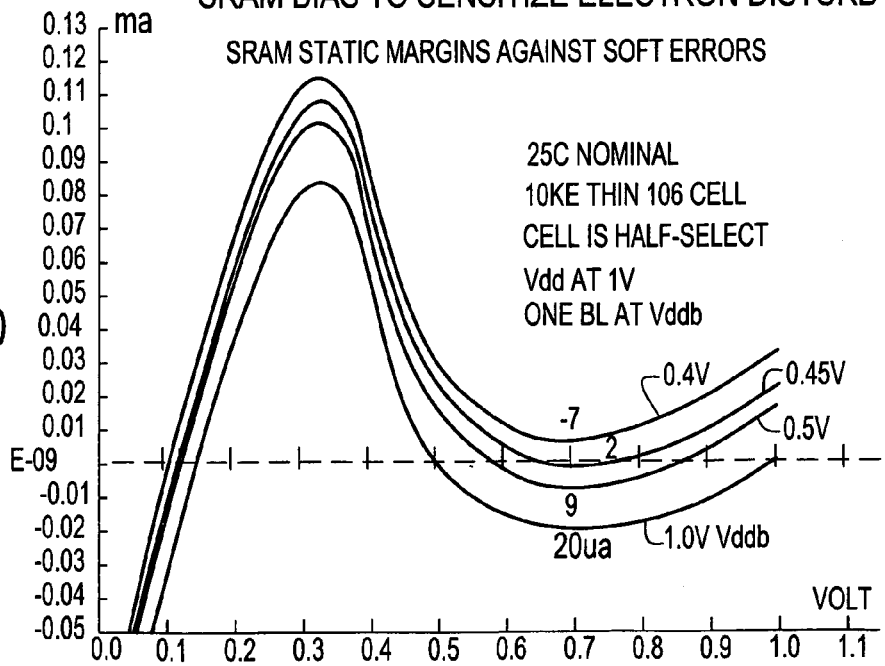
FIG. 10 depicts corresponding Ncurves associated when the BL bias is lowered to near Vss on 'ONE' side of the cell.

An even further accelerated test is to just lower the BL bias to near Vss on the 'ONE' side of the cell. The corresponding Ncurves are shown in FIG. 10. The Icrit1 can be cut down to 2 uA with BL bias (Vddb) at 0.45V. This alternative approach does not require the lowering of the supply voltage. Thus, concerns of spurious defects confusing the soft error testing are eliminated. However, since conventional designs normally bias BLs to Vdd, this "Design For Test" needs to bring out separate BL biases, one for BL (BL true) and one for bBL (BL complement). Another approach is to lower both BL (BL true) and one for bBL (BL complement) to below ½ Vdd to decrease Icrit1.

Figure 11:
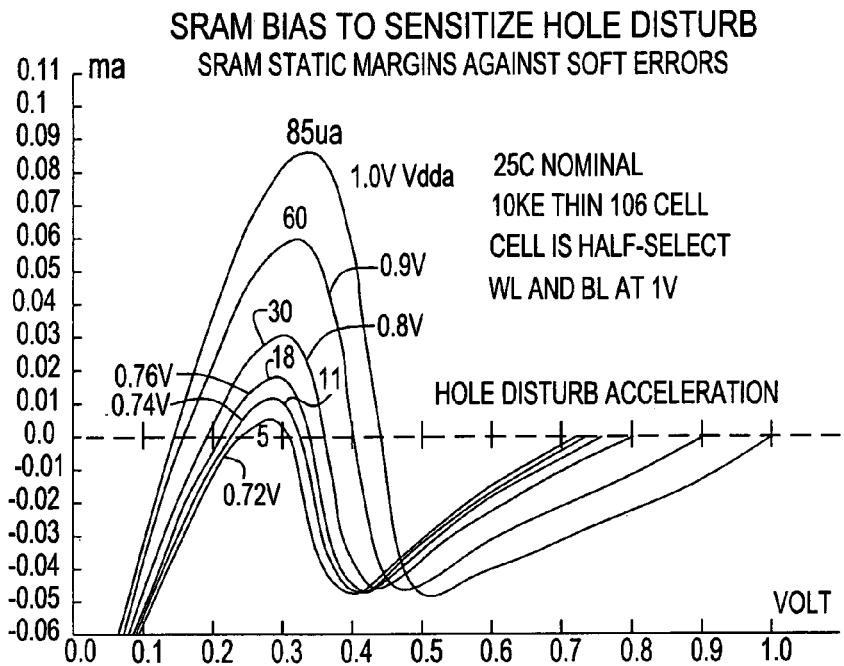
FIG. 11 depicts corresponding Ncurves associated with increased SRAM sensitivity to hole collection by PFETs, resulting in the 'ZERO' node flipping to a 'ONE'; and, FIG. 12 depicts the methodology 300 for adapting the second SRAM array 50 for high SEU immunity according to the present invention.

Since Icrit0 is generally >>Icrit1, hole collection by PFETs is not expected to dominate the soft error rate. As shown in FIG. 11, the Icrit0 alone can be dramatically reduced with the Vdda pinching while keeping Icrit1 essentially unchanged. Vdda is the supply voltage to the cell, which is lowered with respect to Vdd in the SRAM periphery. It is estimated that if Vdda=0.75V and Vdd=1V the Icrit0 is reduced below Icrit1 by about 3×. Thus, the SRAM is sensitized to hole collection by PFETs, resulting in the 'ZERO' node flipping to 'ONE'. If the overall Vdd is lowered as shown in FIGS. 10 and 11, both Icrit0 & Icrit1 are reduced. Thus, the soft errors are still dominated by electron collection by NFETs. In this case, the extent of soft errors from hole collection would remain undetermined from the SER data.

By dynamically adjusting, i.e., raising, the bias on the N-well of the pull-up PFETs, these devices can be weakened. In this case cell stability is degraded in the presence of ion irradiation without the need for raising the wordline voltages. Thus, in a third embodiment, accelerated data of SER sensitivity can be collected while the cells are in standby. In order to determine if the cell has been disturbed during standby, the irradiating ion source should be disabled during the read operation. If the ion source were to remain active during readout, some uncertainty about the failure mode would remain. This uncertainty may be further minimized by maximizing the standby time with respect to the read access time.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A method for adapting sensitivity of a memory device to single event upsets (SEUs) due to ionizing particles, said method comprising:
   providing a first memory device adapted for receiving single event upsets due to ionizing particles;
   generating fail rate data at said first memory device;
   providing a control device for receiving said fail rate data input from the first memory device;
   determining a predetermined SEU fail rate for said second memory device;
   dynamically applying voltage biases to a second memory device, said voltage biases optimally mapped according to said predetermined SEU fail rate,
   wherein an operating point for said second memory device is dynamically achieved that balances SEU immunity and memory device performance.

2. The method according to claim 1, wherein said first and second memory devices include a SRAM having nMOS FET and PMOS FET devices.

3. The method according to claim 2, wherein said voltage level settings are applied to one or more of: an N-well supply voltage (Vnw), a P-well supply voltage (Vpw), and a supply voltage Vdd, said voltage level settings of Vnw, Vdd, Vpw set to meet said predetermined SEU fail rate.

4. The method according to claim 3, wherein said first memory device adapted for receiving single event upsets is programmed with voltage biases levels to provide an accelerated SEU failure rate.

5. The method according to claim 4, further including providing a worst case bias setting on said first memory array to achieve said accelerated SEU failure rate.

6. The method according to claim 3, wherein said accelerated SEU failure rate is achieved by operating said first memory device with a high back bias (Vpw) on the NFET transfer devices, high N-well bias (Vnw) on the PFET pull-up devices, or low power supply voltage (Vdd).

7. The method according to claim 3, wherein said determining a predetermined SEU fail rate for said second memory device comprises: comparing fail rate data generated by said first memory device with pre-programmed data describing dependence of bit fail rate of the second memory device to the N-well supply voltage (Vnw), P-well supply voltage (Vpw) and a device supply voltage Vdd.

8. The method according to claim 7, wherein said determining a predetermined SEU fail rate comprises:
converting said fail rate data generated by said first memory device to a nominal fail rate value representing a failure rate with nominal bias in a given physical environment;
comparing said nominal fail rate value against a pre-programmed value indicating a maximum failure rate allowed for said given physical environment; and,
calculating a soft error margin value representing the difference between the maximum allowed failure rate value and said nominal fail rate value.

9. The method according to claim 8, further including: mapping said calculated soft error margin value to optimal voltage bias settings for said second memory device.

10. A system for adapting sensitivity of a memory device to single event upsets (SEUs) due to ionizing particles, said system comprising:
a first memory array adapted to receive single event upsets due to ionizing particles, said first memory array providing fail rate data;
a control device for receiving said fail rate data input from the first sensing memory array and determining a predetermined SEU fail rate for said second memory device, said control device further generating signals adapted for use in setting voltages voltage biases for said second memory device according to said predetermined SEU fail rate; and,
means responsive to said signals for dynamically applying voltage biases to said second memory device,
wherein an operating point for said second memory device is dynamically achieved that balances SEU immunity and memory device performance.

11. The system according to claim 10, wherein said first and second memory devices include a SRAM having nMOS FET and PMOS FET devices.

12. The system according to claim 11, wherein said voltage level settings are applied to one or more of: an N-well supply voltage (Vnw), a P-well supply voltage (Vpw), and a supply voltage Vdd, said voltage level settings of Vnw, Vdd, Vpw set to meet said predetermined SEU fail rate.

13. The system according to claim 12, further comprising means for applying said first memory device with voltage biases levels to provide an accelerated SEU failure rate.

14. The system according to claim 13, wherein said applying means provides a worst case bias setting on said first memory array to achieve said accelerated SEU failure rate.

15. The system according to claim 12, wherein said accelerated SEU failure rate is achieved by operating said first memory device with a large back bias (Vpw) on the NFET transfer devices, large N-well bias (Vnw) on the PFET pull-up devices, or low power supply voltage (Vdd).

16. The system according to claim 12, wherein said control device determines a predetermined SEU fail rate for said second memory device by: comparing fail rate data generated by said first memory device with pre-programmed data describing dependence of bit fail rate of the second memory device to the N-well supply voltage (Vnw), P-well supply voltage (Vpw) and a device supply voltage Vdd.

17. The system according to claim 16, wherein said determining a predetermined SEU fail rate comprises:
converting said fail rate data generated by said first memory device to a nominal fail rate value representing a failure rate with nominal bias in a given physical environment;
comparing said nominal fail rate value against a pre-programmed value indicating a maximum failure rate allowed for said given physical environment;
calculating a soft error margin value representing the difference between the maximum allowed failure rate value and said nominal fail rate value; and,
mapping said calculated soft error margin value to optimal voltage bias settings for said second memory device.

18. The system according to claim 10, wherein said first and second memory devices comprise SRAM cells built on an SOI substrate.

19. The system according to claim 10, wherein said first and second memory devices comprise SRAM cells built on a bulk substrate having a triple-well structure.

20. The system according to claim 10, wherein said means responsive to said signals for dynamically applying voltage biases to said second memory device comprise one or more charge control pump devices.

* * * * *